United States Patent [19]

Murphy

[11] Patent Number: 5,088,930
[45] Date of Patent: Feb. 18, 1992

[54] INTEGRATED CIRCUIT SOCKET WITH REED-SHAPED LEADS

[75] Inventor: James V. Murphy, Warwick, R.I.

[73] Assignee: Advanced Interconnections Corporation, Warwick, R.I.

[21] Appl. No.: 616,180

[22] Filed: Nov. 20, 1990

[51] Int. Cl.[5] .......................................... H01R 23/72
[52] U.S. Cl. ................................. 439/70; 439/330; 439/912
[58] Field of Search ................... 439/68–73, 439/330, 331, 525, 526, 912

[56] References Cited

U.S. PATENT DOCUMENTS

| | | | |
|---|---|---|---|
| 2,000,318 | 5/1935 | Cannon | 439/298 |
| 3,441,853 | 4/1969 | Bodine | 439/70 |
| 4,089,575 | 5/1978 | Grabbe | 439/71 |
| 4,226,492 | 10/1980 | Deo et al. | 439/70 |
| 4,354,718 | 10/1982 | Bright et al. | 439/526 |
| 4,417,777 | 11/1983 | Bamford | 439/526 |
| 4,470,650 | 9/1984 | Lundergan | 439/70 |
| 4,547,031 | 10/1985 | Korsunsky | 439/76 |
| 4,560,218 | 12/1985 | Billman et al. | 339/17 CF |
| 4,616,895 | 10/1986 | Yoshizaki et al. | 439/330 |
| 4,637,670 | 1/1987 | Coller et al. | 439/55 |
| 4,872,845 | 10/1989 | Korsunsky et al. | 439/70 |
| 4,907,976 | 3/1990 | Killcommons | 439/72 |

FOREIGN PATENT DOCUMENTS 63-182577 7/1988 Japan ................... 439/71

OTHER PUBLICATIONS

Brochure, AMP Micro-Pitch Socket for Jedec Plastic Quad Flat Pack ICs, 6 pages.
Plastronics, Drawing No. C1052QP, Gullwing Quadpack Carrier-Cutaway; Drawing No. C1052QP, Quadpack Carrier-Isometric 52-Pin, Drawing No. CIXXXQP, Gullwing Quadpack Carrier Automation Profiles.
Brochure, Yamaichi, Production Use IC Socket, 5 pages.
Brochure, Yamaichi, Flat Pack, 7 pages.
Advertisement, Nepenthe/Yamaichi, "25 Mil Spacing? No Problem", 1 page.
Advertisement, 3M, 100 Lead Quad Flat Pack Socket Qualified 80386SX/80376/82370/82310, 4 pages.
Brochure, 3M, Textool Produktionssockel fur Plastic Quad Flat Pack-Bauteile, 3 pages.
Brochure, Wells Electronics, Inc., Welcon Burn-In/Test Sockets Contactors And Carriers, 4 pages.
Brochure, Azimuth Electronics, Inc., 30 Years of Socket Technology, 2 pages.
Advanced Interconnections, sketches, 6 pages.

*Primary Examiner*—Neil Abrams
*Attorney, Agent, or Firm*—Fish & Richardson

[57] ABSTRACT

A socket has several upwardly extending resilient single-reed-shaped contacts that connect to downwardly extending portions of leads of an integrated circuit package. A bottom section supports these contacts and the leads of the socket, which are connected to the contacts. The contacts may be integral to lead frame elements, make a wiping contact over at least half of the downward section or at least 0.02 inches, extend from the bottom surface of the package, press inwardly or outwardly against the package leads, and are separated and maintained in registration by ribs. A top section with ribs separates and maintains the package leads in registration and a resilient reed retains the package in the top section. A pin-and-socket connector maintains the top section in place. The package leads are retained by a surface against the force applied by the contacts. The socket leads are pins supported by the bottom section and are connected to a lead frame element and the bottom section is made of a molded thermoplastic in which the elements are at least partially embedded. The socket leads and contacts are integral to the same lead frame elements and may be adapted for through-hole insertion or surface mount and may have the same footprint as the package. The socket may include a cover.

27 Claims, 10 Drawing Sheets

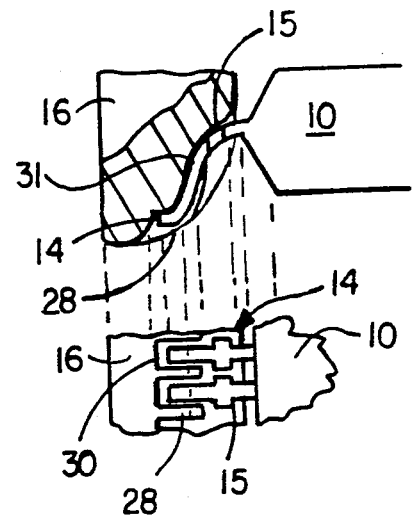
FIG. 8a
FIG. 8b
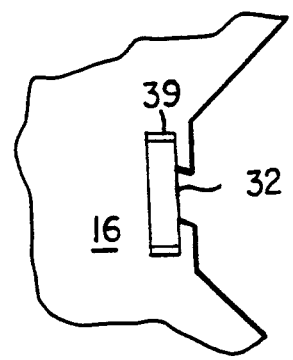
FIG. 9b
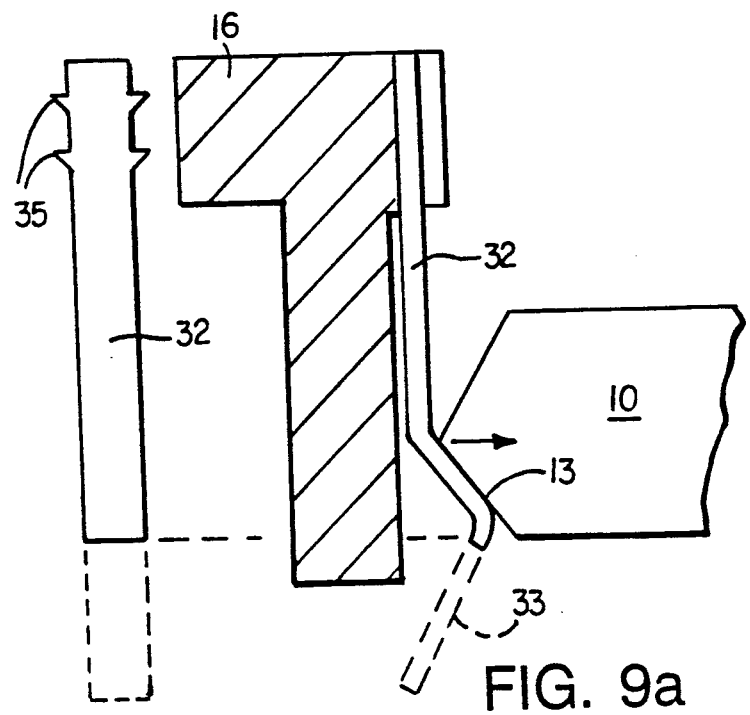
FIG. 9a
FIG. 9C

INTEGRATED CIRCUIT SOCKET WITH REED-SHAPED LEADS

BACKGROUND OF THE INVENTION

Quad flat pack (QFP) packages are among the types of packages used to house semiconductors and to provide connections from the semiconductor to the underlying circuit board. The leads of the QFP package are typically soldered to a printed circuit board. It is also known to provide adapters or sockets for these packages so that they may be removably installed on circuit boards. Examples of such adapters may be found in my co-pending application entitled GULLWING CIRCUIT ADAPTER, Ser. No. 07/505,733, filed Apr. 6, 1990, and herein incorporated by reference.

One known socket for removably installing a QFP package includes a top section that holds the package and a bottom section with tuning-fork shaped contacts having a connecting surface for connection to the inner surface of the package leads.

SUMMARY OF THE INVENTION

In general, the invention includes a socket that has several upwardly extending resilient single-reed-shaped contacts that connect to downwardly extending portions of the leads of an integrated circuit package. A bottom section supports these contacts and the leads of the socket, which are connected to the contacts.

In preferred embodiments, the contacts are integral to lead frame elements, make a wiping contact over at least half of the downward section or at least 0.02 inches, extend from the bottom surface of the package, press inwardly or outwardly against the package leads, and are separated and maintained in registration by ribs; a top section with ribs separates and maintains the package leads in registration; a resilient reed retains the package in the top section; a pin-and-socket connector maintains the top section in place; the package leads are retained by a surface between ribs in the top section against the force applied by the contacts; the socket leads are pins supported by the bottom section and are each connected to a lead frame element; the bottom section is made of a molded thermoplastic; the lead frame elements are at least partially embedded in said bottom section; the socket leads and contacts are integral to the same lead frame elements; the leads may be adapted for through-hole insertion or surface mount and may have the same footprint as that of the package; the socket includes a cover. Embodiments may be made by providing lead frame elements from more than one lead frame by successive steps of bending, attaching and trimming of the lead frames.

The socket of the invention provides a reliable long stroke wiping contact to package leads such as QFP leads. The metal contacts are durable and may be made inexpensively from one or more lead frames. The molded sections allow for precise tolerances in the registration of the package leads and the contacts, and prevent them from touching each other. The fact that the top body portion is retained by a pin-and-socket mechanism avoids complex and expensive mold cavity shapes. A socket of the invention may be inexpensively provided that has the same footprint as the package it is intended to accept, and may be provided for very small lead spacings. As the lead frames in a socket of the invention may include curved horizontal portions, numerous footprints may be accommodated. Further, since the reed contacts are long for a package of a given height, they can accommodate large variations in the tolerances of the package leads. These benefits allow for an inexpensive and reliable 0.3 mm pitch QFP socket. Test clips according to the invention allow connection to a device soldered in place and may be easily inspected during assembly.

BRIEF DESCRIPTION OF THE DRAWINGS

FIG. 8a is a partial cross-sectional view, along 8a—8a of FIG. 10, showing the top section of the socket of FIG. 4 and its associated package.

FIG. 8b presents an orthographic projection of the bottom of the top section of the socket of FIG. 8a with a package installed, further showing the relationship between the top section ribs and the leads of the package.

FIG. 9a is a partial cross sectional view, along 9a—9a of FIG. 10, showing the top section of the socket of FIG. 4, its package retaining reed and a portion of its associated package.

FIG. 9b is a top view of the portion of the socket shown in FIG. 9a.

FIG. 9c is a side view of the package retaining reed shown in FIG. 9a.

DESCRIPTION OF THE PREFERRED EMBODIMENT

Figure 1:
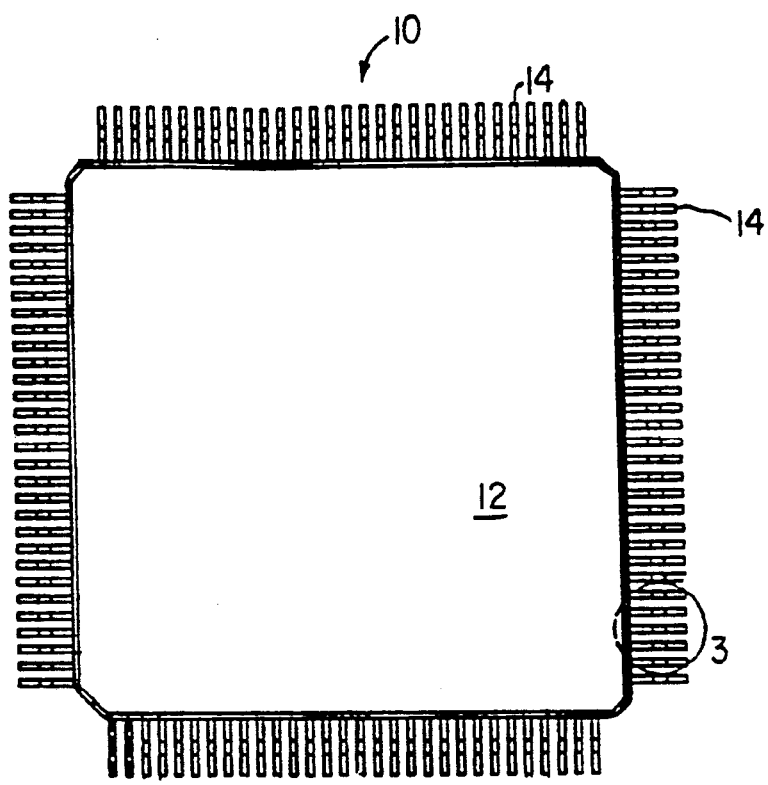
FIG. 1 is a top plan view of a QFP package.
Figure 2:
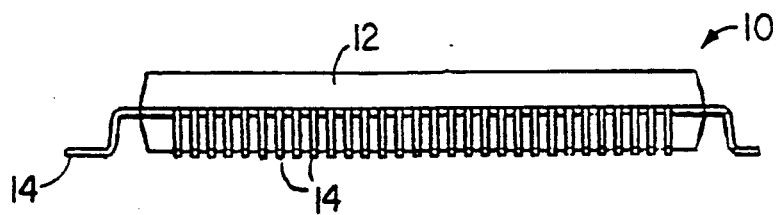
FIG. 2 is a side elevation of the QFP package of FIG. 1.
Figure 4:
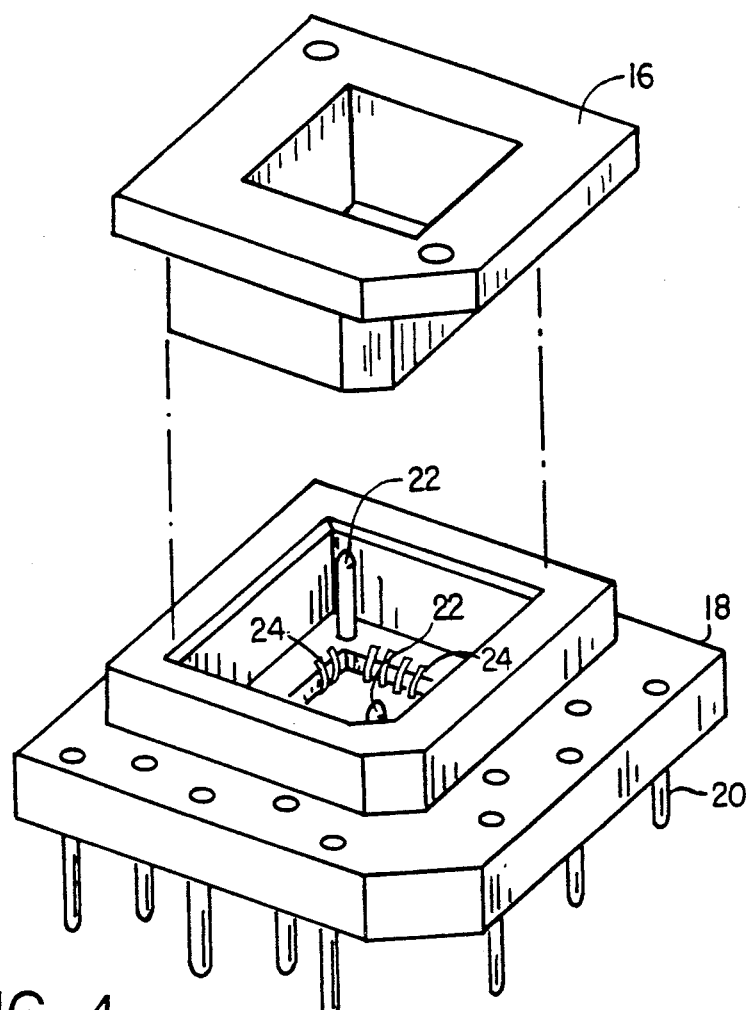
FIG. 4 is an exploded perspective view of a socket for QFP packages.

Referring to FIGS. 1 and 2, a QFP package 10 includes a body 12 and leads 14. A socket for receiving such a package (FIGS. 4, 5) includes a top section 16 and a bottom (or lead supporting) section 18. These sections are made of injection molded thermoplastic such as PPS or LCP. Socket leads 20 extend downwardly and allow connection to a circuit board or a socket (not shown).

Figure 5:
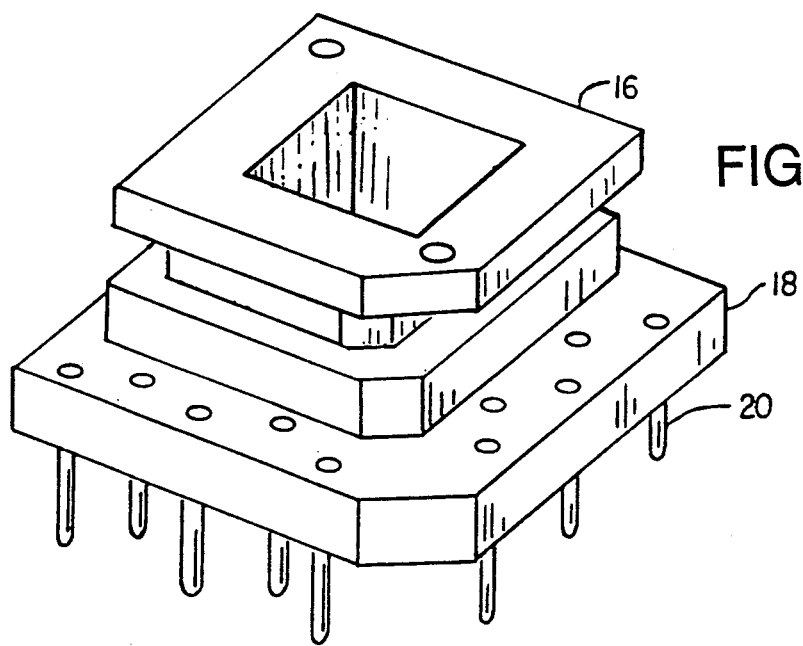
FIG. 5 is a perspective view of the socket of FIG. 4 with its top section fully engaged in its bottom section.
Figure 11:
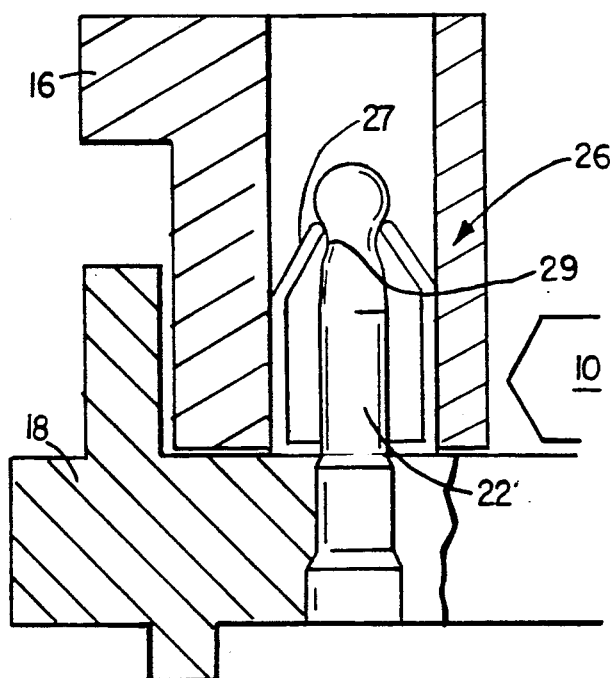
FIG. 11 is a cross sectional view along 11—11 of FIG. 10.

Retaining pins 22 extend upwardly within the bottom section to engage receptacles 26 in the top section (see also FIGS. 7 and 11) and thereby retain the top section in the engaged position shown in FIG. 5. The receptacles 26 include resilient pin retaining elements 27 that bear against the pins at gentle curves 29 to positively retain the top section on the bottom section. This method of retaining the top section is advantageous in that it avoids the necessity of molded-in latch portions and the like, which generally require complex and expensive mold cavities.

A series of contacts 24, which connect to the socket leads 20, extend upwardly into the cavity formed within the bottom section. These contacts make contact with the package leads when a package is installed in the socket.

Figure 6:
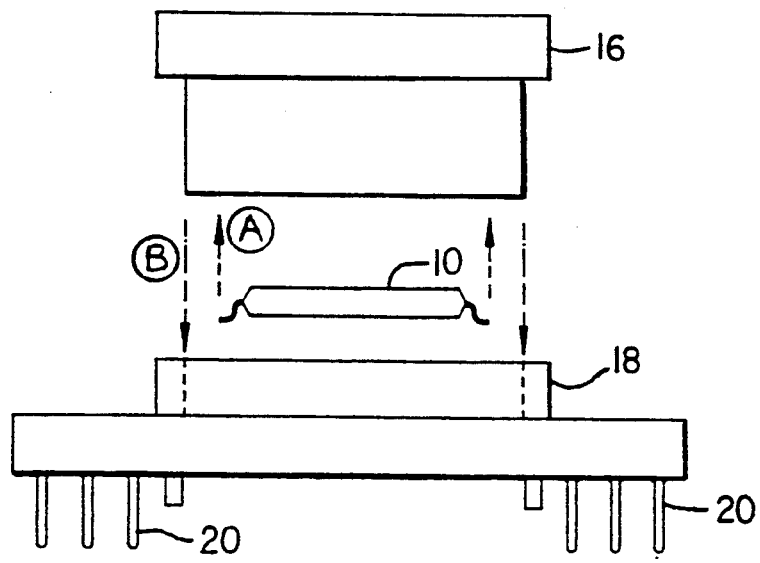
FIG. 6 is an exploded plan view of the socket of FIG. 4 and its associated integrated circuit package.

Referring to FIG. 6, a package is first inserted into the top section of the socket (step A), and then the top section is inserted into the bottom section (step B). The top section has ribs 28 (FIG. 7) that separate channels 30. These channels accept the leads of the package and maintain them in a definite, separated, position. FIGS. 8a-8b illustrate the relation between the leads of the package and the ribs.

Figure 3:
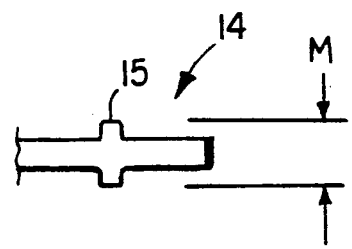
FIG. 3 is a partial top plan view of a single lead of the package of FIG. 1 taken from the circled area of FIG. 1.

Referring to FIG. 3, an individual lead 14 typically includes a dam bar portion 15. The tolerances of the maximum width M of this dam bar portion are generally quite large. For this reason, the top section ribs 28 (FIGS. 8a-8b) are made short enough that they do not interfere with the dam bar portions.

As shown in FIGS. 7 and 9a-c, a resilient package retaining reed 32 extends downward at one corner of the top section to retain the package in place within the top section by biasing it sideways. The retaining reed 32 is bent to apply a force on the lower surface 13 of the side of the package and may be extended 33 into a hole (not shown) in the bottom section. The retaining reed 32 includes teeth 35 that bite into the walls of a slot 39 in the top portion 16 and hold it in place.

Figure 19:
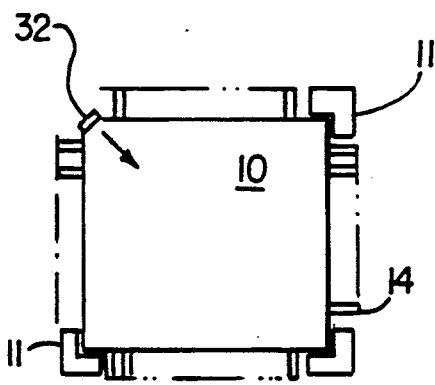
FIG. 19 is a top view of the package retaining features of the socket of FIG. 4.

FIG. 19 shows the features that retain the package in place in the top section. The retaining reed 32 presses the package 10 along a chamfered corner of the package and causes one or more of the other corners of the package to bear against the insides of the corner portions 11 of the top section 16. The corner of the top section that includes a retaining reed is keyed 34 (FIG. 7) to prevent the package from being inserted in an incorrect orientation.

Figure 10:
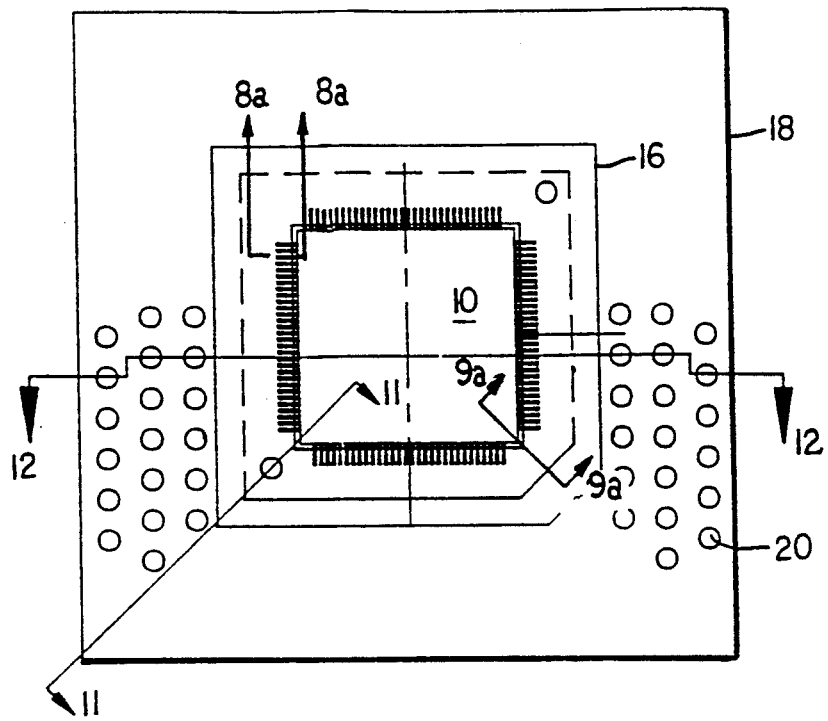
FIG. 10 is a top plan view of the socket of FIG. 4 and its associated package.

As shown in FIG. 10, the socket lead pins 20 are arranged on a grid having an offset outer row of pins. This grid is offset in this manner to allow for a maximum number of circuit traces to be placed between the required holes in a circuit board designed to accept the socket.

Figure 12:
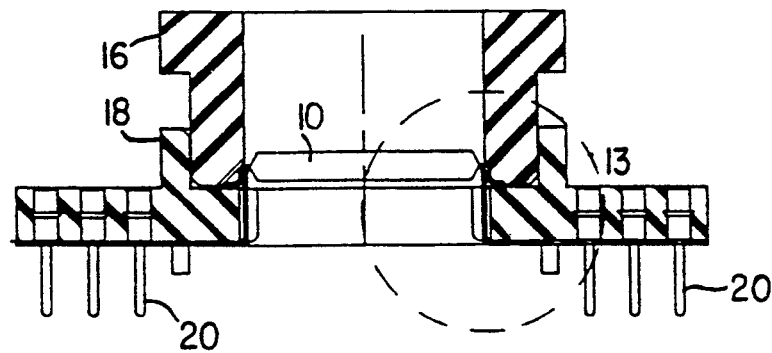
FIG. 12 is a cross sectional view along 12—12 of FIG. 10.
Figure 13:
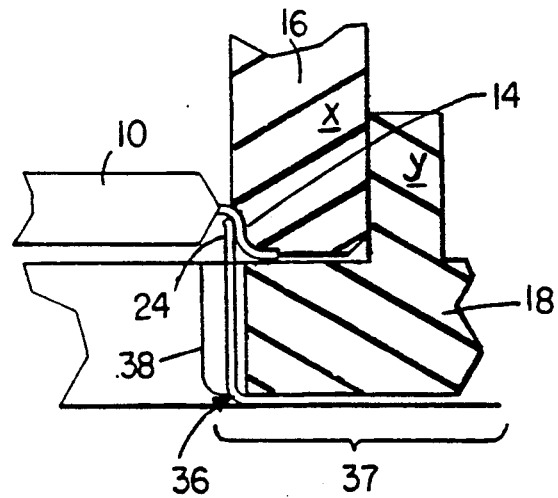
FIG. 13 is an enlargement of the portion of FIG. 12 within the circle marked "13".

Referring to FIGS. 12 and 13, the reed-shaped contacts 24 are each part of a lead frame element 36 which also extends along the lower surface of the bottom section 18. Pins are installed in the lower section 18 to connect to the lead frame elements 36. Methods of connecting pins and lead frame elements are described in detail in my copending applications entitled MOLDED-IN LEAD FRAMES, Ser. Nos. 07/121,568 and 07/272,074, filed Nov. 17, 1987 and Nov. 16, 1988 respectively, and herein incorporated by reference.

Figure 7:
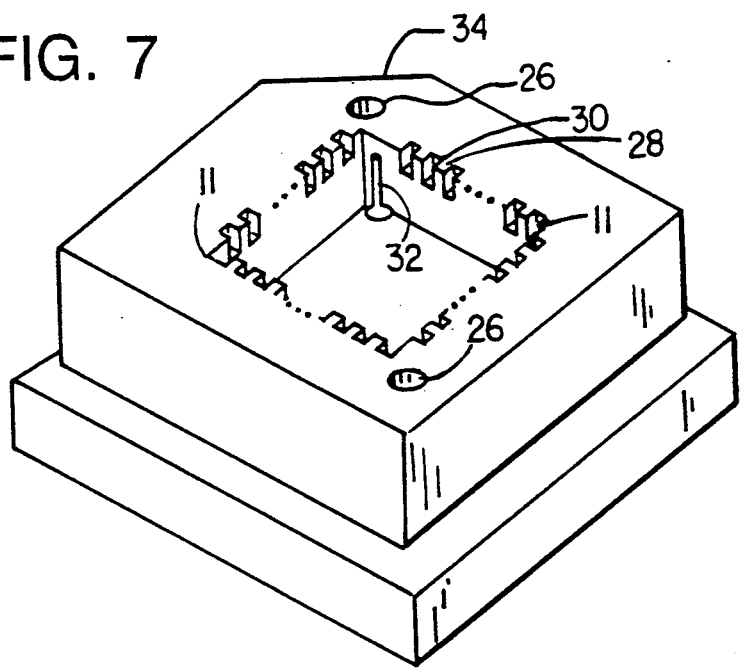
FIG. 7 is an upside-down perspective view of the top section of the socket of FIG. 4.

Ribs 38 separate the contacts 24 and maintain them in registration with the package leads. The resilient contacts 24 engage the package leads 14 in a wiping contact when the top portion is engaged in the bottom portion. This wiping action covers a significant portion of the inner surface of the package lead (i.e., at least half), or at least 0.02 inches in the case of a 0.3 millimeter lead pitch. This provides for a reliable contact. The resilience of the lead frame elements 36 is sufficient to provide a contact force of 15 grams per pin between the contacts and the package leads. This force is applied by the contact to the lead, which bears against the inside retaining surface 31 of the channel 30 (FIGS. 7 and 8).

Because the reeds begin at the bottom surface of the bottom section (see FIG. 13), the reeds have a long cantilever arm, for a given package height. This allows the arm to be flexible and to accommodate package leads with high tolerance variations.

Since the top and bottom sections of the socket are injection molded, the ribs on each of these sections may be positioned quite precisely and will have non-cumulative tolerances. This is particularly advantageous for smaller pitch packages.

The top section and the bottom section are molded to fit closely so that the ribs in the top section and the ribs in the bottom section are maintained in alignment. This keeps the reed contacts in alignment with the package leads. Referring to FIG. 13, this is done by keeping the distance between top wall portion x and bottom wall portion y small.

Figure 16:
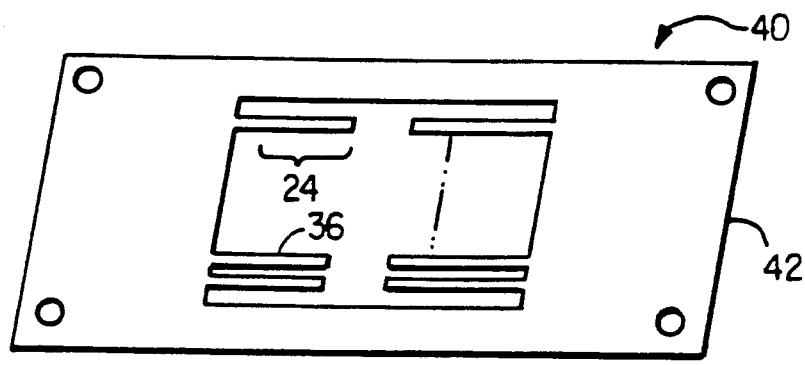
FIG. 16 is a plan view of a lead frame for making a socket.
Figure 17:
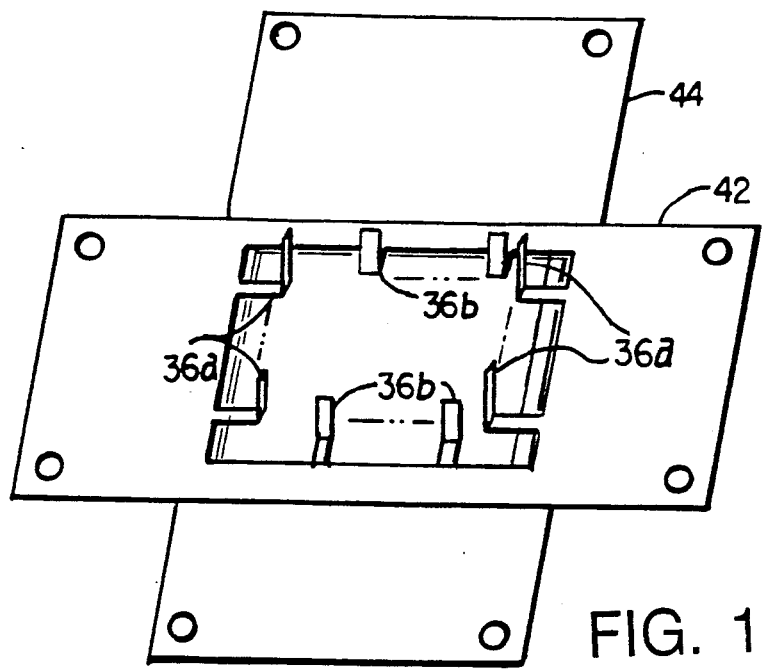
FIG. 17 is a perspective view of two lead frames juxtaposed to illustrate the spatial relationship of their respective lead elements as they are to be installed.

Referring to FIGS. 16 and 17, the socket of the invention is manufactured using a pair of lead frames. Each lead frame includes a series of lead frame element portions 36 and a frame portion 42. The leads 36a of a first lead frame are first bent into their upwardly extending positions. The lead frame is then installed in corresponding grooves that are molded in the lower section, and the lead frame is heat sealed in place. This method of assembly is described in detail in my co-pending application entitled MOLDED INTEGRATED CIRCUIT PACKAGE, Ser. No. 07/564,406, filed Aug. 8, 1990, and herein incorporated by reference.

Once sealed in place, the frame portion 42 is cut away. A second lead frame is then bent and heat sealed in place at right angles to the first, and its frame portion is cut away. This dual-lead frame assembly method allows for the use of lead frame elements that are quite long. FIG. 17 illustrates the relationship between leads 36a from the first lead frame 42 and leads 36b from the second lead frame 44.

This process could, of course, be extended to more than two lead frames, if necessary. For example, one lead frame could be used for each side, for a total of four lead frames. If the geometry of the socket permits (i.e., the reed contacts are short enough), a single lead frame could also be used.

The use of lead frames in the assembly method is advantageous in that multiple leads are installed at the same time. Also, the tolerances of the lead positions, due to the method of manufacture of the lead frame, are non-cumulative.

The horizontal portion 37 of the lead frame (FIG. 13) that is heat sealed in place need not be stamped to be straight and perpendicular with its associated reed contact 24. It may be shaped as needed, much like a trace on a printed circuit board, to accommodate a variety of footprints.

This may result in space-efficient use of real estate. For example, in the embodiment of FIG. 10, pins may be placed all around the outer edge of the bottom section, not just in direct alignment with the contacts. This use of lead frames also allows the particular optimized offset pattern of the socket of FIG. 10.

Figure 14:
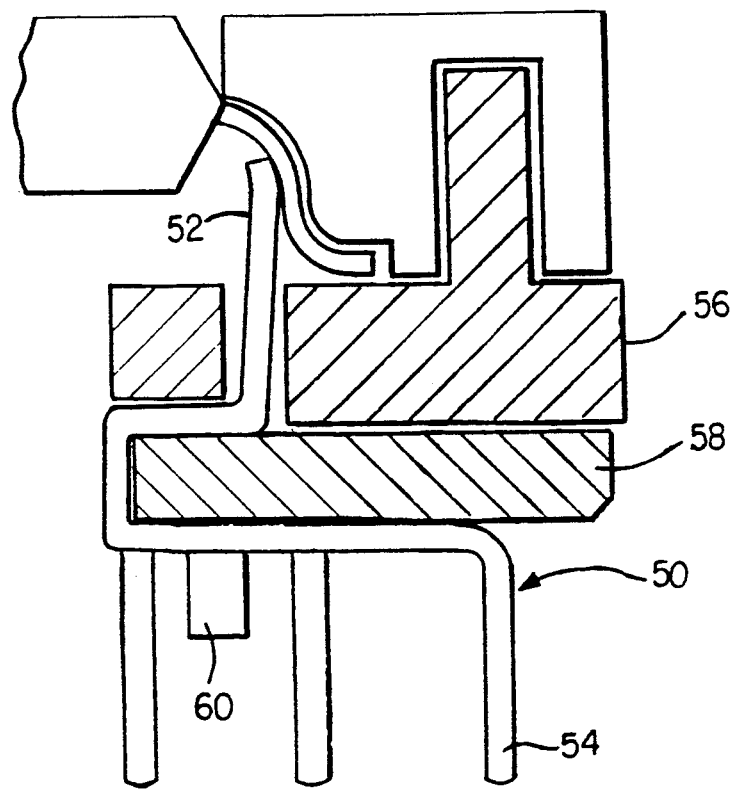
FIG. 14 is a partial cross-sectional view of a socket having integral through-hole socket leads and contacts.

FIG. 14 shows a cross section of a portion of an embodiment of the invention wherein a lead frame 50 acts as both a contact 52 and a lead 54. In this embodiment, the lead is embedded between two bottom sections 56, 58. This is performed by heat sealing the lead frame to one of the pre-molded sections, and assembling the other section around the resulting assembly by press fitting or ultrasonic plastic welding. This type of process is described in my earlier referenced co-pending application entitled MOLDED INTEGRATED CIRCUIT PACKAGE Ser. No. 07/564,406, filed Aug. 8, 1990. Standoff 60 is also molded in this second operation.

Figure 15:
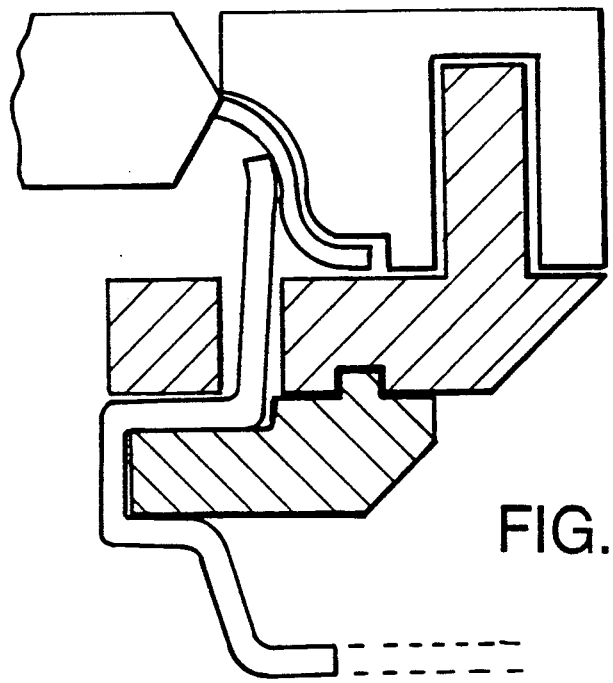
FIG. 15 is a partial cross-sectional view of a socket having integral surface-mount socket leads and contacts.

FIG. 15 shows a cross section of a portion of an embodiment of the invention that is similar to the embodiment of FIG. 14 except that its leads are bent into a gullwing shape to form a QFP-type footprint. It will be observed that the embodiment of FIG. 15 has the same footprint as the package that it is intended to accept. Although not necessary, this is particularly advantageous as the same circuit board may be fitted with a socket, (e.g., for prototyping purposes) or a package (e.g., for large-scale production).

In the embodiments of FIGS. 14 and 15, the reeds are not held between ribs, but protrude through holes which perform the alignment function.

Figure 18:
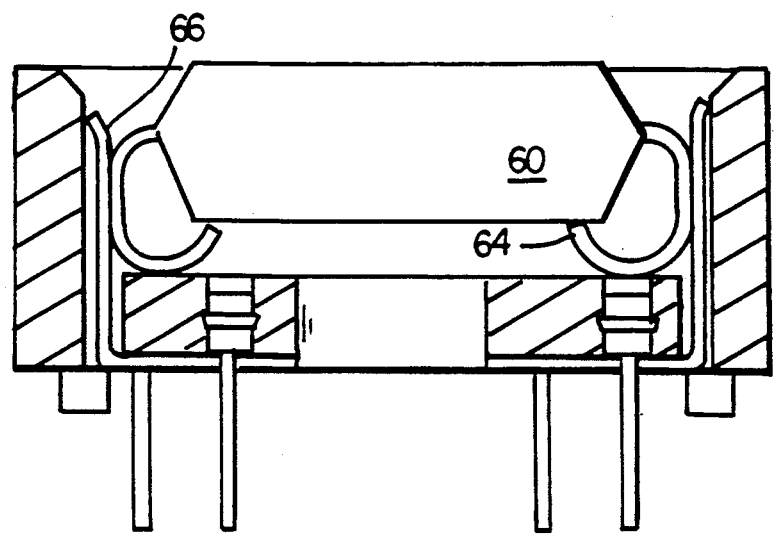
FIG. 18 is a cross sectional view of a socket for LCC type packages.

FIG. 18 shows a socket for leadless chip carrier (LCC) type packages that may be manufactured in a manner similar to that employed for the above described embodiments. In this socket, the reed-shaped contacts 66 provide an inward contact force to the leads 64 of the package 60.

Figure 20:
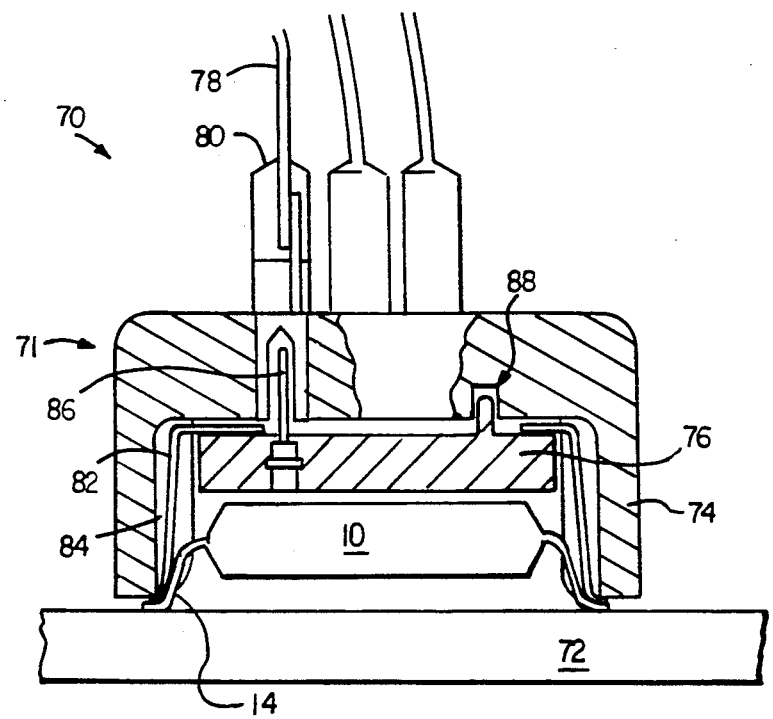
FIG. 20 is a two-part cross sectional view of a test clip for QFP devices designed to accept a cable having female connectors.
Figure 22:
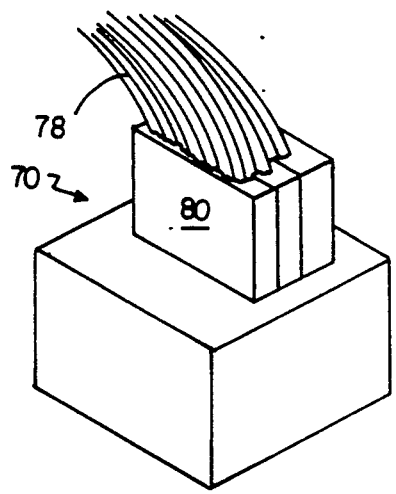
FIG. 22 is a perspective view of the test clip of FIG. 20.

FIGS. 20 and 22 show a test cable assembly 70 that may be clipped onto a QFP package 10 that is soldered in place, for example on a printed circuit board 72. The assembly 70 includes a series of conductors 78 (e.g., in the form of ribbon cables) and a clip portion 71. The conductors have receptacle ends 80 that mate with pins 86 in the clip portion 71.

The clip portion includes reed-shaped contacts 82 that are connected to the pins 86. Ribs 84 separate the contacts, which provide an inward force to make contact with the outer surface of the leads 14.

The clip portion is made by attaching bent lead frame elements 82, from one or more lead frames, to the inner section 76 of the clip, preferably by heat sealing. Pins 86 are then press-fit into the inner (or lead frame supporting) section 76 and soldered to the lead frame element 82. An outer section 74, bearing the lead-separating ribs 84, is then placed around the inner section 76 and attached thereto (e.g., by ultrasonic plastic welding at a notch joint 88). The two-section construction allows inspection of the solder joints before assembly of the sections.

Figure 21:
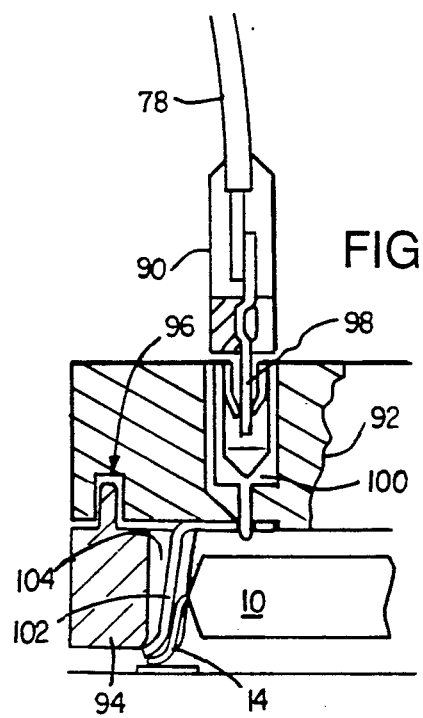
FIG. 21 is a partial cross sectional view of a test clip for QFP devices designed to accept a cable having male connectors.

Referring to FIG. 21, a clip that accepts male connectors may also be made. In this embodiment, the conductors 78 are connected to male connectors 90. Receptacles 100 in the upper (or lead frame supporting) section 92 accept the pins 98 of these connectors and are soldered to reed-shaped contacts 102 that make contact with the leads 14 of the package 10. A separate upper section 92 and a ribbed 104 lower section 94 are assembled at the notch joint 96 after soldering, to provide for intermediate inspection of the solder joints.

A reed, as shown in FIGS. 9a–9c, is embedded in the test clip embodiments presented and serves to hold the test clip in place on the package.

It will be observed that electrical interfacing elements for integrated circuit packages, such as sockets and test clip assemblies, may be manufactured according to the invention for a wide variety of integrated circuit package types.

Other embodiments are within the following claims. Indications of direction such as vertical and downward are used in the claims because ordinarily the socket (or other interfacing element) is installed by vertical movement relative to the IC package. In the event that the direction of installation were other than vertical, these expressions should be understood as meaning generally along the direction of installation.

I claim:

1. A socket for connection to the leads of a quad flat pack type integrated circuit package, said package having a body and each said lead having a downwardly extending section proximate a side of said body, said socket comprising:
    a plurality of socket leads for connection to a circuit bearing element such as a printed circuit board,
    a supporting section for supporting said socket leads, and
    a plurality of vertically extending resilient single-reed-shaped contacts supported by said supporting section at positions that allow said contacts to bend when coming into contact with the downwardly extending sections of corresponding package leads, so that said contacts press outwardly against said package leads between said package leads and said side of said body, said contacts maintaining contact with the downwardly extending sections of said package leads when the package and the socket are in a mater position, said contacts being lead frame elements, a plurality of which having been separated from a single lead frame and remain in the same relative positions as they were in said lead frame, and each of said contacts being electrically connected to one of said socket leads.

2. The socket of claim 1 wherein said contacts make a wiping contact over at least half of the downward section of the package leads upon mating the package and said socket.

3. The socket of claim 1 wherein said contacts make a wiping contact over at least 0.02 inches of the downward section of the package leads upon mating the package and said socket.

4. The socket of claim 1 wherein said reed-shaped contacts extend upwardly from the bottom surface of the socket.

5. The socket of claim 1 wherein said contacts are separated and maintained in registration by ribs in said supporting section.

6. The socket of claim 1, wherein said supporting section is a bottom section and further including a top section for holding the package when installing the package on said bottom section, said top section including top section ribs to separate and maintain the package leads in registration.

7. The socket of claim 6 wherein said top section further includes a resilient reed for retaining the package in said top section.

8. The socket of claim 6 further including a pin-and-socket connector for maintaining said top section in place on said bottom section.

9. The socket of claim 6 wherein said top section provides a retaining surface for retaining the package leads against the outward force applied by said contacts against the package leads.

10. The socket of claim 1 wherein said socket leads comprise pins supported by said supporting section and are each connected to one of said lead frame elements.

11. The socket of claim 1 wherein said socket leads comprise receptacles supported by said supporting section and are each connected to one of said lead frame elements.

12. The socket of claim 1 wherein said supporting section is made of a molded thermoplastic.

13. The socket of claim 12 wherein said lead frame elements are at least partially embedded in said supporting section.

14. The socket of claim 1 wherein each of said socket leads is integral to one of said lead frame elements.

15. The socket of claim 14 wherein said led frame elements are bent to form said package leads for through-hole insertion into a circuit bearing element.

16. The socket of claim 14 wherein said lead frame elements leads are bent to form said package leads into a gullwing shape for surface mount attachment to the circuit bearing element.

17. The socket of claim 1 wherein said socket leads have the same footprint as does the package.

18. The socket of claim 1 wherein a first group of said lead frame elements are cut from a first lead frame and a second group of said lead frame elements are cut from a second lead frame.

19. A socket for connection to the leads of a quad flat pack type integrated circuit package, said package having a body and each said lead having a downwardly extending section proximate a side of said body, said socket comprising:
   a plurality of socket leads for connection to a circuit bearing element such as a printed circuit board,
   a molded bottom section for supporting said socket leads,
   a plurality of vertically extending resilient single-reed-shaped contacts at least partially embedded in said bottom section at positions that allow said contacts to bend when coming into contact with the downwardly extending sections of corresponding package leads, so that said contacts press outwardly against said package leads between said package leads and said side of said body to make a wiping contact to a surface of said downwardly extending section, said contacts maintaining contact with the downwardly extending sections of said package leads when the package and the socket are in a mated position, said contacts being lead frame elements, a plurality of which having been separated from a single lead frame and remain in the same relative positions as they were in said lead frame, and each of said contacts being electrically connected to one of said socket leads, said bottom section including ribs for maintaining said contacts separated and in registration, and
   a top section for holding the package when installing the package on said bottom section, said top section including top section ribs to separate and maintain the package leads in registration.

20. The socket of claim 19 wherein said contacts make a wiping contact over at least half of the downwardly section of said package leads upon installing the package in said socket.

21. The socket of claim 19 wherein said contacts make a wiping contact over at least 0.02 inches of the downwardly section of said package leads upon installing the package in said socket.

22. The socket of claim 19 further including a pin-and-socket connector for maintaining said top section in place on said bottom section, and wherein said top section provides a retaining surface for retaining the package leads against a force applied by said contacts against the package leads.

23. The socket of claim 19 wherein said socket leads are pins supported by said bottom section and are each connected to one of said lead frame elements, and wherein said reed-shaped contacts extend upwardly from the bottom surface of the package.

24. The socket of claim 19 wherein each of said leads is integral to one of said lead frame elements and wherein each of said lead frame elements is bent to form a lead for through-hole insertion into a circuit bearing element.

25. The socket of claim 19 wherein each of said leads is integral to one of said lead frame elements and wherein each of said lead frame elements is bent to form a gullwing shaped lead for surface mount attachment to a circuit bearing element.

26. The socket of claim 19 wherein each of said leads is integral to one of said lead frame elements and wherein each of said lead frame elements is bent to form a gullwing shaped lead for surface mount attachment to a circuit bearing element having the same footprint as does the package.

27. The socket of claim 19 wherein a first group of said lead frame elements are cut from a first lead frame and a second group of said lead frame elements are cut from a second lead frame.

* * * * *